(12) United States Patent
Chou et al.

(10) Patent No.: US 6,751,127 B1
(45) Date of Patent: Jun. 15, 2004

(54) SYSTEMS AND METHODS FOR REFRESHING NON-VOLATILE MEMORY

(75) Inventors: Ming-Hung Chou, Hsinchu (TW); Chia Hsing Chen, Hsinchu (TW)

(73) Assignee: Macronix International, Co. Ltd., Hsinchu (TW)

( * ) Notice: Subject to any disclaimer, the term of this patent is extended or adjusted under 35 U.S.C. 154(b) by 0 days.

(21) Appl. No.: 10/132,118

(22) Filed: Apr. 24, 2002

(51) Int. Cl.[7] .............................................. G11C 16/06
(52) U.S. Cl. ............................ 365/185.25; 365/185.11; 365/185.33
(58) Field of Search ........................ 365/185.21, 185.11, 365/185.33

(56) References Cited

U.S. PATENT DOCUMENTS

| | | | |
|---|---|---|---|
| 5,239,505 A | * | 8/1993 | Fazio et al. ............ 365/185.11 |
| 5,365,486 A | | 11/1994 | Schreck |
| 5,765,185 A | | 6/1998 | Lambrache et al. |
| 5,909,449 A | | 6/1999 | So et al. |
| 6,088,268 A | | 7/2000 | Gupta et al. |
| 6,240,032 B1 | * | 5/2001 | Fukumoto ................. 365/222 |

* cited by examiner

*Primary Examiner*—Hoai Ho
(74) *Attorney, Agent, or Firm*—Knobbe, Martens, Olson & Bear LLP

(57) ABSTRACT

The present invention is related to methods and systems for refreshing non-volatile memories. A rewrite operation is performed followed by a refresh operation. The refresh operation is performed within a fixed time beginning at the byte cells associated with the selected bit line and proceeding to sequentially refersh cells associated with other bit lines. Cell currents are measured, and if a cell current meets a first criteria, the corresponding cell is refreshed.

21 Claims, 6 Drawing Sheets

SYSTEMS AND METHODS FOR REFRESHING NON-VOLATILE MEMORY

BACKGROUND OF THE INVENTION

1. Field of the Invention

The present invention relates to non-volatile, rewritable memory and in particular, to methods and systems for refreshing non-volatile, rewritable memory arrays.

2. Description of the Related Art

In a typical FLASH memory array, the memory cells are arranged in a rectangular array of rows and columns to form intersections at which there are disposed memory cell transistors. The drain of each transistor is connected to a corresponding bit line, the source of each transistor is connected to an array source voltage by an array source line, and the gate of each transistor is connected to a wordline.

Typical FLASH memories allow cells to programmed, read or erased in bulk, sectors or pages. In addition, some FLASH memories can be operated in an EEPROM mode, where from the user perspective, cells can be programmed, read or erased on a byte basis. Cells are conventionally programmed by driving selected bit lines connected to the memory cell transistor drains to a first voltage and driving the gates of the memory cell transistors connected to selected wordlines to a second higher voltage to perform hot electron injection.

The erasure of FLASH memory cell data is performed by driving the gate of a memory cell transistor to a voltage that is substantially less than a voltage placed on the bit line. In doing so, electrons are tunneled off of the floating gate of the memory cell transistor. By way of example, the erase operation can be performed as a bulk erase, which erases the entire FLASH memory array, a sector erase, which erases a FLASH memory array sector, or a page erase, which erases a single sector row. If the FLASH memory can be operated in an EEPROM mode, then the erasure can, from the user perspective, be performed on a byte basis.

However, FLASH memories are subject to a disturb phenomenon during erase and program operations. Because memory cells may share the same bit lines across sectors, voltages placed on these bit lines produce electrical field effects on the sectors sharing the bit lines. Furthermore, memory cells within different sectors may share wordlines, and voltages on these shared wordlines create field effects in the sectors sharing them.

The electric fields generated on the shared bit lines and wordlines may have the effect of inadvertently erasing programmed bits or programming erased bits. For example, raising the voltage on a wordline to program an erased bit may disturb a previously programmed bit on the same wordline by removing some electrons from the floating gate to the control gate of the previously programmed bit. Thus, the sector cells need to be refreshed after each erase or program operation or after a predetermined number of erase or program cycles.

One conventional technique for performing refresh operations is to perform a refresh on an entire sector after each erase/program operation, where the contents of the sector to be refreshed are buffered and then rewritten. However, the buffer used to store the sector contents utilizes a significant amount of area and so the sector size may need to be constrained to reduce the buffer size. Another conventional technique for determining when to perform a refresh operation is to count the number of erase or program cycles using a counter, and performing a refresh after a predetermined number of cycles. However, such counters are often of insufficient reliability. Hence these conventional refresh techniques fail to provide a refresh process that is both efficient and reliable.

SUMMARY OF THE INVENTION

The present invention is directed to methods and systems for refreshing non-volatile memories, such as FLASH memories that can be operated in an EEPROM mode. In particular, one embodiment of the present invention embeds a refresh process in a write operation. After each program/erase cycle, a refresh operation is performed beginning at the byte cells associated with the selected bit line and proceeding sequentially. In one embodiment, a cell current is measured, and if the cell current meets a first criteria, the cell is refreshed.

In particular, a predetermined amount of time is allocated for performing a refresh process, including both the actual refresh and a verify process. Using an embodiment of the present invention, if the cells associated with a wordline can sustain more than N cycles without needing to be refreshed, then 1/N sectors can be sequentially refreshed after each erase or program operation. This is in contrast to some conventional techniques that refresh an entire sector after each erase or program operation. Advantageously, the present invention reduces the size needed for a refresh buffer and enables enlargement of the sector size by a factor N, without use of a refresh cycle counter.

In particular, a write or rewrite operation includes 3 embedded operations: an erase operation, a program operation, and a refresh operation. During the refresh operation, a FLASH cell floating gate is charged using Channel Hot Electron injection (CHE) by providing a high bias on the gate and an elevate bias on the drain. In one embodiment, a cell is refreshed when the cell current falls within a predetermined range. Thus, rather then refreshing every cell within a sector when performing a refresh operation, the refresh operation is performed on those cells whose cell current falls within a predetermined range.

BRIEF DESCRIPTION OF THE DRAWINGS

Throughout the drawings, like reference numbers are used to reference items that are identical or functionally similar.

For purposes of summarizing the invention, certain aspects, advantages and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF PREFERRED EMBODIMENTS

Embodiments of the present invention are related to methods and systems for refreshing re-writable non-volatile solid-state memory memories. In particular, a refresh operation is embedded in a write or rewrite operation. As is described in greater detail below, in one embodiment after a byte is rewritten, a refresh operation is performed within a predetermined amount of time starting from the bit line selected during the rewrite operation.

Advantageously, rather then refreshing every cell within a sector when a refresh operation is performed, the refresh operation is performed when a given cell's cell current falls within a predetermined range. For example, perhaps only 1% of the cells will have cell currents that fall within the predetermined range. Thus, the refresh process is both quicker and utilizes less buffer space than many conventional approaches. Optionally, the refresh process is embedded in a write or a rewrite operation that further includes erase and program operations. After each program/erase cycle, a refresh operation is performed beginning at the byte cells associated with the selected bit line and proceeding sequentially.

It will be understood that the circuits, voltage, currents, and the like described below are for illustrative purposes only. Thus, the invention may be embodied or carried out using other circuits, voltages and/or currents.

Figure 1:
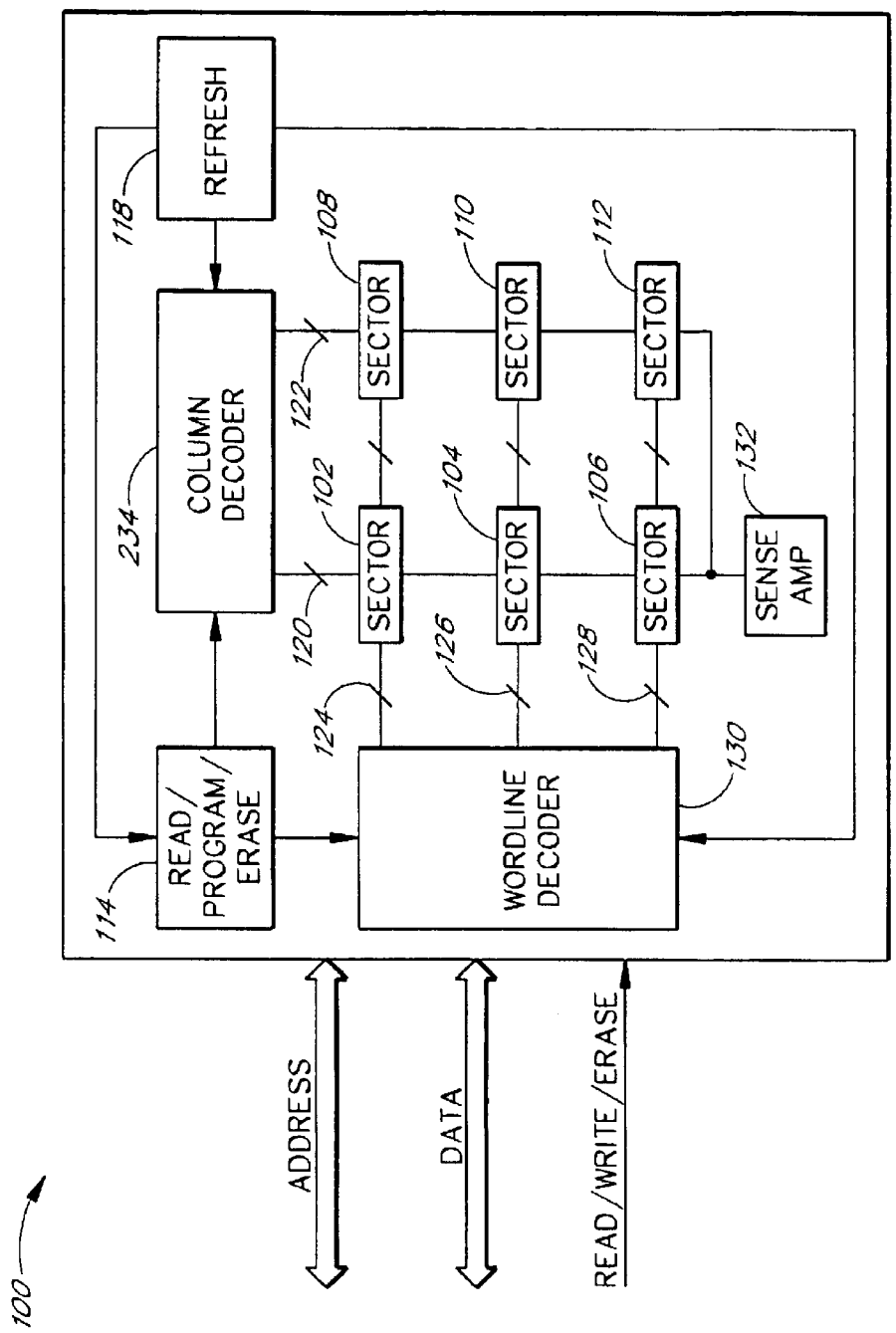
FIG. 1 illustrates an example block diagram of a FLASH memory circuit in accordance with one embodiment of the present invention.

FIG. 1 illustrates an example block diagram of a portion of a non-volatile memory circuit 100 in accordance with one embodiment of the present invention. Advantageously, the memory circuit is configured to act in both EEPROM and FLASH memory modes. In the EEPROM mode, data can be written a byte at a time, while in FLASH mode, data can be written a sector or page at a time. The memory circuit 100 includes a plurality of sectors 102, 104, 106, 108, 110, 112 of memory cells coupled to a column decoder 134 and a wordline decoder 112. Sectors 102, 104, 106 share common bit lines 120 from the column decoder 134 and sectors 108, 110, 112 share common bit lines 122 from the column decoder 134. Sectors 102 and 108 share common wordlines 124 from wordline decoder 130, sectors 104 and 110 share common wordlines 126 from the wordline decoder 130, and sectors 106 and 112 share common wordlines 128 from the wordline decoder 130. More generally, each wordline represents one of M rows, wherein each of the M rows has N words. The number of bit lines is the same as the number of N words in a row multiplied by the number of bits in each word.

An Erase/Program/Read circuit 114 is coupled to the column decoder 134 and the wordline decoder 130. A refresh circuit 118 is coupled to the Erase/Program/Read circuit 114, the column decoder 134, and the wordline decoder 130. As described in greater detail below the refresh circuit 118 is used to appropriately refresh cells to ensure that disturb conditions do alter data. A disturb condition can arise because memory cells share the same bit lines across sectors, so that voltages placed on these bit lines produce electrical field effects on the sectors sharing the bit lines. A disturb condition can also arise because memory cells within different sectors may share wordlines, and voltages on these shared wordlines create field effects in the sectors sharing them. Thus, erasing one sector can inadvertently cause the values of bits in other sectors to change, and so a refresh operations needs to be performed so that the values do not inadvertently change.

Figure 2:
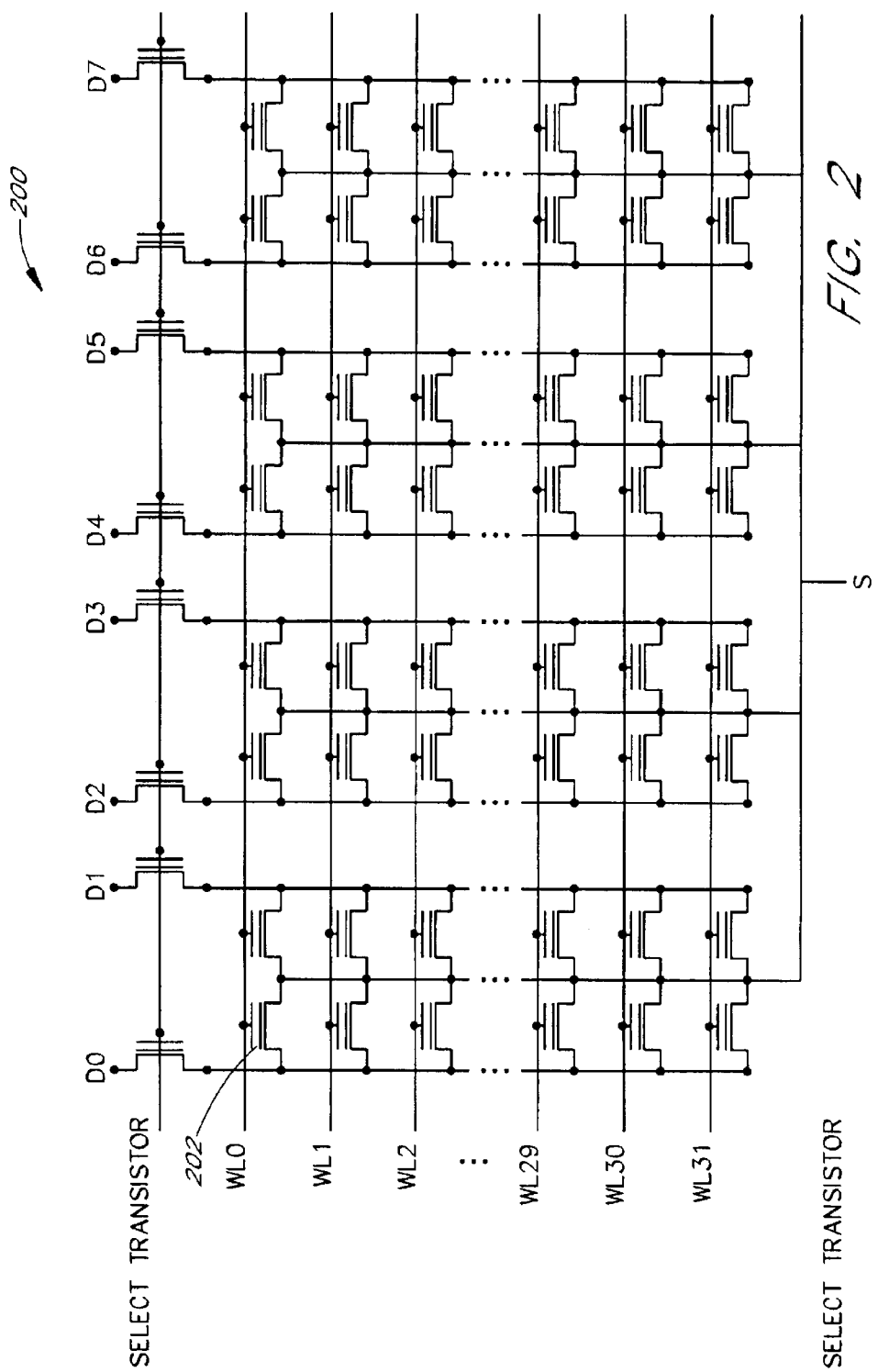
FIG. 2 illustrates a schematic of an example portion of a FLASH memory circuit.

FIG. 2 illustrates a schematic of an example portion 200 of a FLASH memory circuit sector, such as sector 102 illustrated in FIG. 1. The example sector includes 32 cells per bit line and has 32 wordlines (WL), with 256 bytes connected to the same wordline driver. Each memory cell is coupled to one wordline and one bit line. For each of the cells disposed at the intersection of a wordline and a bit line, the drain of the cell is connected to the bit line, the source of the cell is connected to an array source voltage by an array source line, and the gate of the cell is connected to the wordline. For example, memory cell 202 has a control gate coupled to wordline 204, a drain coupled to bit line 204 and a source connected to the array source line (S). In the example embodiment, the sources of the memory cells within a particular sector are commonly coupled to the array source line (S). A sense amplifier 132, as illustrated in FIG. 1, reads selected bits.

As described in greater detail below, a rewrite process includes 3 operations: an erase operation, a program operation, and a refresh operation. During the refresh operation, a memory cell floating gate is charged using Channel Hot Electron injection (CHE) by providing a high bias on the gate and an elevated bias on the drain.

Figure 3:
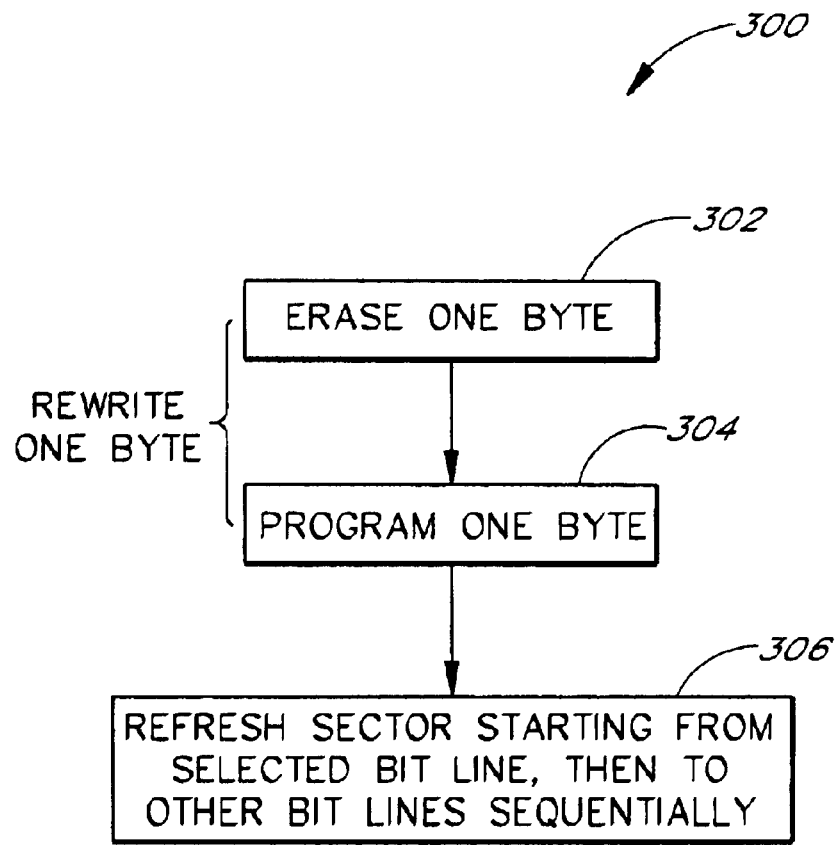
FIG. 3 illustrates a flow diagram of one example method of refreshing a FLASH memory circuit.

FIG. 3 illustrates an example rewrite process 300 used when the non-volatile solid-state memory 100 is being operated in a byte erasable mode. Beginning at state 302, an addressed byte in a first sector is erased. Proceeding to state 304, the addressed byte is then programmed with the desired data. Proceeding to state 306, the refresh operation is performed, starting from the selected bit line, then proceeding sequentially through the next bit lines until the entire sector undergoes the refresh process. Optionally, a fixed period of time, such as 1 ms or 2 ms, can be allocated to perform the refresh process of state 306. The process performed at state 306 is illustrated in greater detail in FIG. 4, as discussed below.

Figure 4:
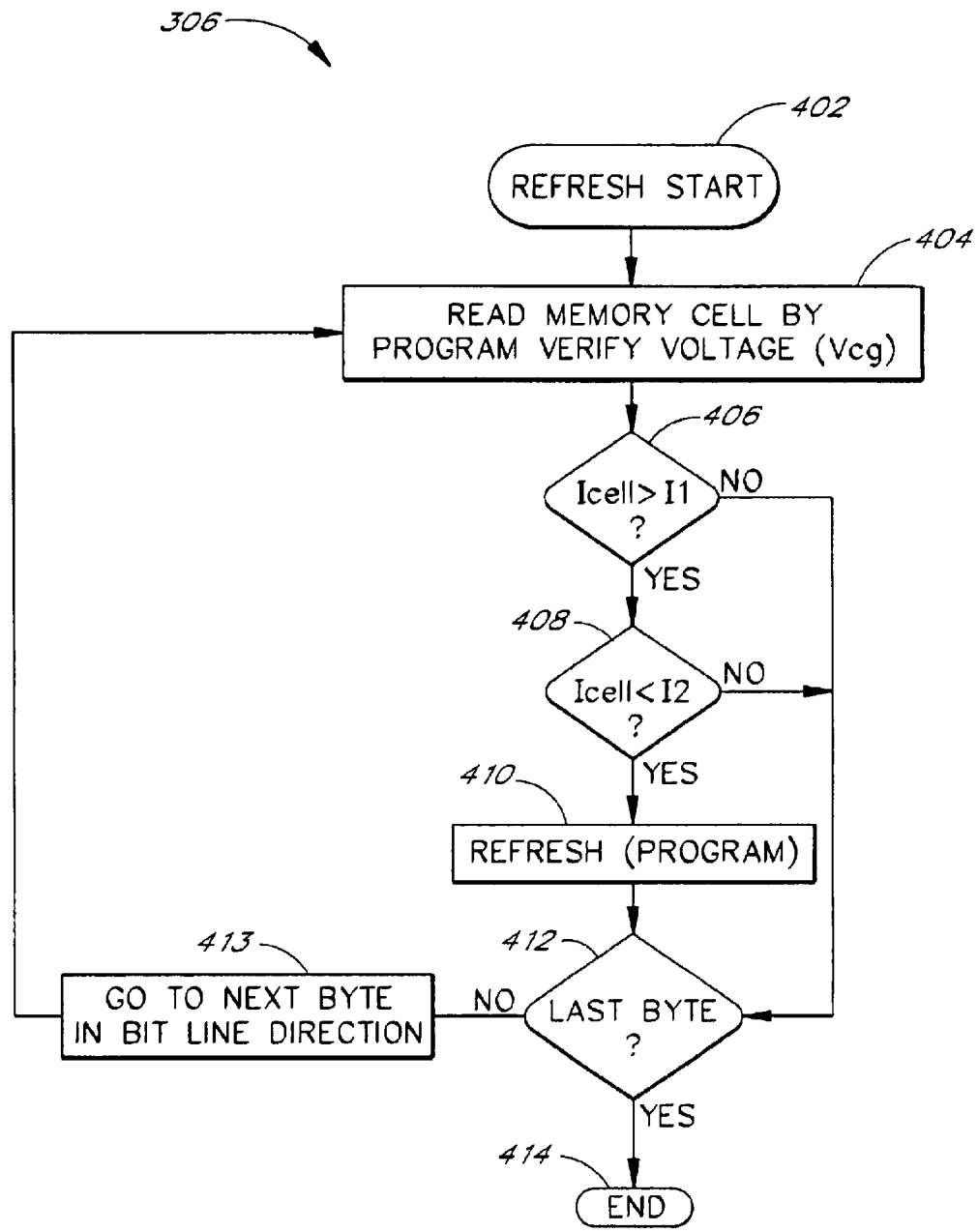
FIG. 4 illustrates a flow diagram of the example method of refreshing a FLASH memory circuit illustrated in FIG. 3 in greater detail.

Referring to FIG. 4, the example refresh process 306 is illustrated in greater detail. As discussed below, the automatic refresh operation determines if the memory cell or cells has a property, such as current, that has reached a threshold value or is within in a desired range, and if so, performs a refresh of the memory cell or cells. Thus, rather then refreshing every cell within a sector, the refresh operation is performed when the cell current falls within a predetermined range. Starting at state 402, the process 306 proceeds to state 404, where the cell control gate is set to a program verify voltage level ($V_g$) and the memory cell is read. By way of example, $V_g$ may be set to 7 Volts.

At state 406 the cell current Icell is measured to determine if Icell is greater than a predetermined threshold value I1, which may be, by way of example 20 μA. If the value of Icell is less than or equal to I1, then a refresh will not be performed and the process 306 proceeds to state 414. If the value of Icell is greater than I1, then the process 306 proceeds to state 408. At state 408 the cell current Icell is measured to determine if Icell is less than a predetermined threshold value I2, which may be, by way of example 40 μA. If the value of Icell is greater than or equal to I2, then a refresh will not be performed and the process 306 proceeds to state 412. If the value of Icell is less than I2, then the process 306 proceeds to state 410. At state 410 the refresh operation is performed.

At state 412 a determination is made as to whether the last sector byte has been evaluated to determine if it is to be refreshed. If it is the last byte, the process 306 ends at state 412. Otherwise, the process 306 proceeds to state 413, where the cell evaluation process proceeds to the next byte associated with the sequentially next bit line, then loops back to state 404, and the process is repeated. Because not all cells in a given sector are refreshed in the same refresh cycle, the time allocated for the refresh operation is greatly reduced. For example, for some array embodiments, only 1% of the cells need to be refreshed at a given time.

Figure 5:
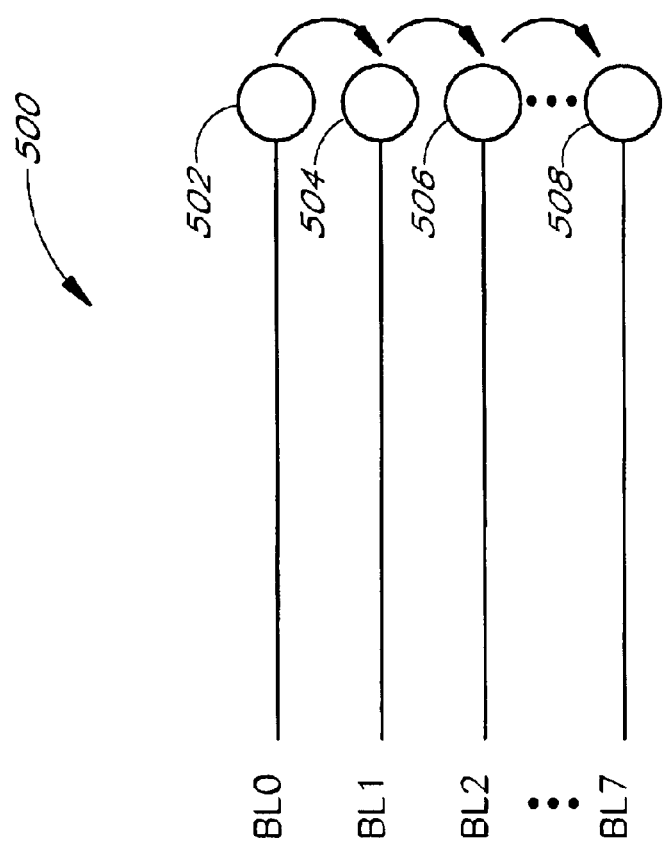
FIG. 5 illustrates an example embodiment of a sequential bit line refresh process.

FIG. 5 illustrates at a high level the refresh sequence. Beginning with the selected bit line BL0, the refresh operation is performed on cells meeting the current criteria and associated with the bit line selected during the program/erase process. Then, cells associated with the subsequent sector bit lines that meet the current criteria are refreshed.

By way of example, using an embodiment of the present invention, if the memory array cells have a 100 cycle endurance at −6.5V $V_g$ before needing to be refreshed, and if the array has 32 cells per bit line as illustrated in FIG. 2, the bytes which are to be refreshed include cells associated with the selected and subsequent bit lines. If the setup overhead per byte is 1.5 μs, the refresh time per byte is 1.5 μs, and 2 wordlines are connected to one wordline driver, with 128 bytes sharing the same wordline, the refresh time that needs to be allocated is less then 1 ms.

TABLE 1

|  | PROGRAM | ERASE | DESCRIPTION |
|---|---|---|---|
| VD | 5 V | Float | VD @program will disturb cell state from high Vt to low Vt |
| VG | 11 V | −7 V | VG @erase will disturb cell state from high Vt to low Vt, VG @program effect is minor |
| VS | 0 V | 6 V | VS @erase will disturb cell state from high Vt to low Vt |
| VB | 0 V | 0 V | No effect |

Table 1 above includes example EEPROM operation conditions and the corresponding cell effects. A significant area of interest is the cell state in the range from high Vt to low Vt. With the program voltage set to 5V and the erase terminal floated, VD (the drain voltage) at program disturbs the cell state from high Vt to low Vt. With the program voltage set to 11V and the erase terminal set to −7V, VG (the gate voltage) at erase disturbs the cell state from high Vt to low Vt. With the program voltage set to 0V and the erase terminal set to 6V, VS (the source voltage) at erase disturbs the cell state from high Vt to low Vt. With the program voltage set to 0V and the erase terminal set to 0V, there is no effect.

Figure 6:
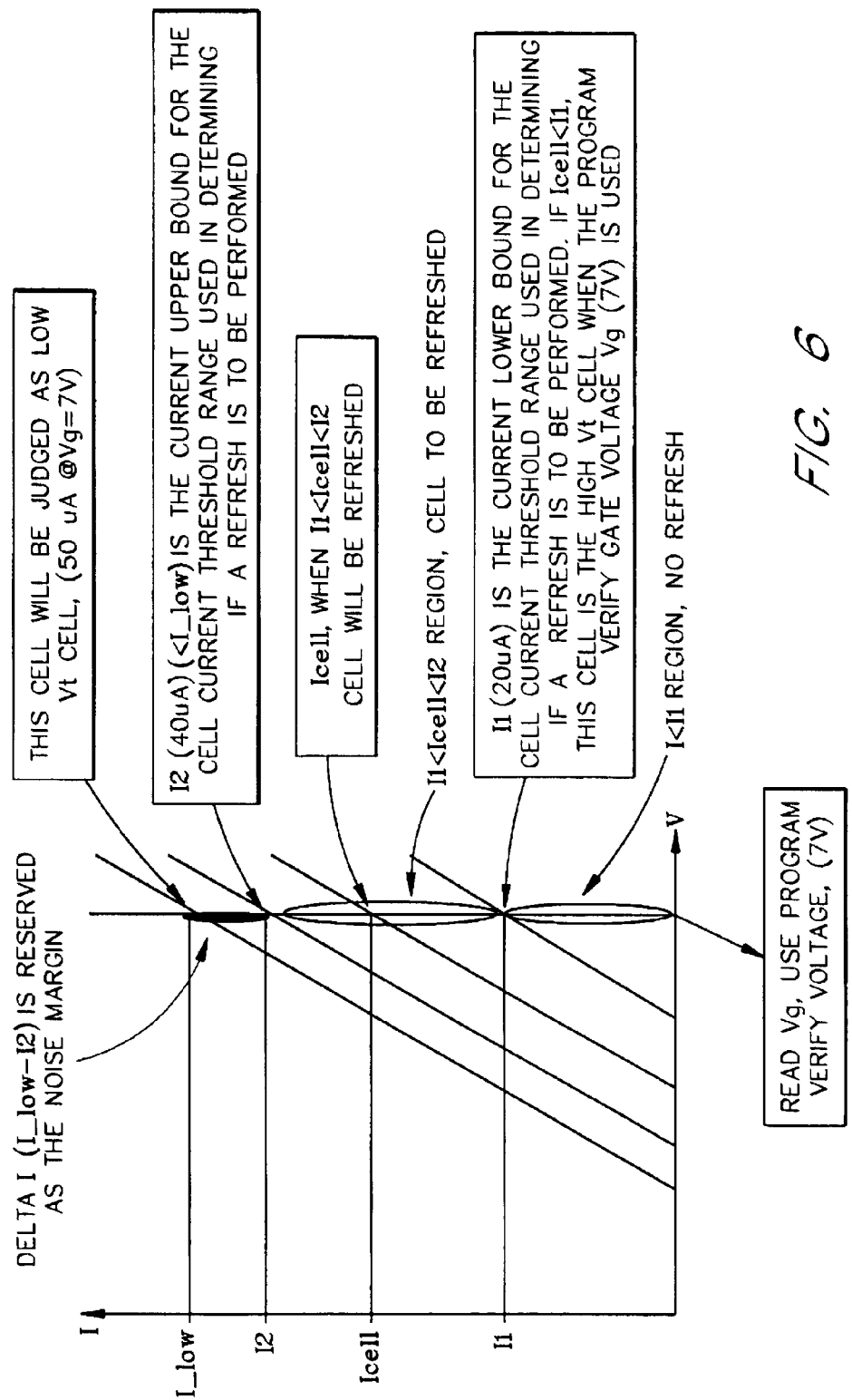
FIG. 6 illustrates an example I–V curve graph.

FIG. 6 illustrates an example Flash cell I–V curve graph for the cell current definition during the refresh determination process illustrated in FIG. 4B, and in particular, at states 406 and 408. The example read voltage is 7V, the lower bound for the cell current Icell is I1 at 20 μA, and the upper bound for the cell current Icell is I2 at 40 μA. If I1<Icell<I2, the cell will be refreshed. If Icell≤I1, then no refresh will be performed. Similarly, if Icell≥I2, then no refresh will be performed.

Table 2 below describes example memory array operation modes.

TABLE 2

| Operation | Memory array operation mode | Flow |
|---|---|---|
| 1 | Program entire sector | Program entire sector (No refresh operation required) |
| 2 | Rewrite one byte (EEPROM function) | Array cell byte erase → program array cell by byte → Fixed time refresh |
| 3 | Sector erase only (erase by flash function) | Erase whole sector (No refresh operation required) |
| 4 | Sector erase and program whole sector (flash operation → 3+1) | Erase whole sector → Program whole sector (No refresh operation required) |

When programming a whole sector in FLASH mode, no refresh operation is required. In EEPROM byte mode, when one byte is to be rewritten, first the corresponding byte is erased. Then the byte is programmed. The refresh operation as illustrated in FIG. 4 is then performed.

When operating in FLASH mode, a sector erase is optionally performed by erasing the entire sector. When operating in FLASH mode, a sector erase and sector program operation is performed by first performing an erase sector operation and then performing a sector program operation. No refresh operation need be performed.

Thus as discussed above, embodiments of the present invention provide reliable and efficient methods for refreshing non-volatile memories. In particular, a refresh process is embedded in a write operation, and cells are evaluated to determine if the cells are is refreshed.

Although this invention has been described in terms of certain preferred embodiments, other embodiments that are apparent to those of ordinary skill in the art are also within the scope of this invention.

What is claimed is:

1. A method of refreshing non-volatile memory cells, the method comprising:

erasing a first byte in a first sector, the first byte associated with a first bit line;

programming the first byte;

refreshing cells within the first sector that are associated with the first bit line and having corresponding cell currents that meet a first criteria; and refreshing cells associated with a next bit line having corresponding cell currents meeting the first criteria.

2. The method as defined in claim 1, wherein the action of refreshing cells within the first sector that are associated with the first bit line and the action of refreshing cells within the first sector that are associated with the second bit line are embedded in a write operation.

3. The method as defined in claim 1, wherein the next bit line is adjacent to the first bit line.

4. The method as defined in claim 1, further comprising sequentially refreshing cells associated with all the sector bit lines within a predetermined amount of time.

5. The method as defined in claim 4, wherein less then 1% of the first sector cells have cell currents that meet the first criteria during the predetermined amount of time.

6. The method as defined in claim 4, wherein the predetermined amount of time is fixed.

7. The method as defined in claim 4, wherein the predetermined amount of time is less than 1 ms.

8. The method as defined in claim 1, wherein a first cell current is read with a gate of a first corresponding cell set to a program verify voltage.

9. A non-volatile memory circuit comprising:

a first bit line coupled to a first column of memory data cells;

a second bit line coupled to a second column of memory data cells; and a refresh circuit configured to measure currents associated with corresponding first column memory data cells to determine which first column memory data cells are to be refreshed and then to measure currents associated with corresponding second column memory data cells to determine which second column memory data cells are to be refreshed, wherein a predetermined amount of time is allocated to perform a refresh operation on the first column of memory data cells and the second column of memory data cells.

10. The non-volatile memory circuit as defined in claim 9, wherein the refresh circuit is configured to perform a refresh operation on at least a first cell at least partly in response to determining that a first cell current is within a first range.

11. The non-volatile memory circuit as defined in claim 9, wherein the refresh circuit is configured to measure currents associated with corresponding first column memory data cells after a program operation.

12. The non-volatile memory circuit as defined in claim 9, wherein the refresh operation is performed on a byte basis.

13. The non-volatile memory circuit as defined in claim 9, wherein the refresh circuit is configured to refresh all cells needing to be refreshed within a sector before a next rewrite operation is performed.

14. A method of operating a non-volatile memory, the method comprising:

performing an erase and program operation on a first byte having at least a first bit cell coupled to a first bit line, the first byte forming a portion of a first sector;

performing a refresh of at least the first bit cell, the refresh of the first bit cell performed at least partly in response to detecting a first condition of the first bit cell; and performing a refresh of at least a second bit cell within the first sector, the second bit cell coupled to a second bit line, the refresh of the second bit cell performed at least partly in response to detecting a second condition of the second bit cell.

15. The method as defined in claim 14, wherein a predetermined amount of time is designated to perform a refresh of the first sector.

16. The method as defined in claim 14, further comprising measuring a cell current associated with the first bit cell before refreshing the first bit cell.

17. The method as defined in claim 14, further comprising determining if the second bit cell has been disturbed.

18. The method as defined in claim 14, wherein the non-volatile memory is a FLASH memory operated in an EEPROM mode.

19. A non-volatile memory circuit comprising:

a first conductor coupled to a first column of memory data cells;

a second conductor coupled to a second column of memory data cells; and a refresh circuit configured to refresh a disturbed portion of the first column of memory data cells in a first sector during a first refresh operation while not refreshing memory data cells in the first sector that are not disturbed and to refresh a disturbed portion of the second column of memory data cells in the first refresh operation.

20. The non-volatile memory circuit as defined in claim 19, wherein the first conductor is a bit line.

21. The non-volatile memory circuit as defined in claim 19, wherein the refresh circuit is configured to determine that a first memory data cell is disturbed based at least in part on a cell current.

* * * * *